United States Patent
Sasaki

(10) Patent No.: US 12,035,638 B2
(45) Date of Patent: Jul. 9, 2024

(54) MAGNETORESISTANCE EFFECT ELEMENT AND MAGNETIC MEMORY

(71) Applicant: TDK CORPORATION, Tokyo (JP)

(72) Inventor: Tomoyuki Sasaki, Tokyo (JP)

(73) Assignee: TDK CORPORATION, Tokyo (JP)

( * ) Notice: Subject to any disclaimer, the term of this patent is extended or adjusted under 35 U.S.C. 154(b) by 406 days.

(21) Appl. No.: 17/463,716

(22) Filed: Sep. 1, 2021

(65) Prior Publication Data

US 2022/0077386 A1    Mar. 10, 2022

(30) Foreign Application Priority Data

Sep. 4, 2020    (JP) .................... 2020-148867

(51) Int. Cl.
| | |
|---|---|
| H10N 52/80 | (2023.01) |
| G11C 11/16 | (2006.01) |
| H10B 61/00 | (2023.01) |
| H10N 50/10 | (2023.01) |
| H10N 50/85 | (2023.01) |
| H10N 52/00 | (2023.01) |

(52) U.S. Cl.
CPC ........... *H10N 52/80* (2023.02); *G11C 11/161* (2013.01); *H10B 61/22* (2023.02); *H10N 50/10* (2023.02); *H10N 52/00* (2023.02); *G11C 11/165* (2013.01); *H10N 50/85* (2023.02)

(58) Field of Classification Search
None
See application file for complete search history.

(56) References Cited

U.S. PATENT DOCUMENTS

| | | | |
|---|---|---|---|
| 8,350,347 B2 | 1/2013 | Gaudin et al. | |
| 9,218,864 B1 * | 12/2015 | Yi | ............... G11C 11/1659 |
| 11,222,656 B1 * | 1/2022 | Le | ............... G11B 5/372 |

(Continued)

FOREIGN PATENT DOCUMENTS

| | | |
|---|---|---|
| JP | 2005-526351 A | 9/2005 |
| JP | 2014-045196 A | 3/2014 |

(Continued)

OTHER PUBLICATIONS

Kato et al.; "Observation of the Spin Hall Effect in Semiconductors"; Science; vol. 306; p. 1910-1913; 2004.

(Continued)

*Primary Examiner* — Kevin M Bernatz
(74) *Attorney, Agent, or Firm* — Oliff PLC

(57) ABSTRACT

A magnetoresistance effect element includes: a laminate in which a first ferromagnetic layer, a non-magnetic layer, and a second ferromagnetic layer are laminated in order in a first direction; a magnetic body that is present on the second ferromagnetic layer or above the second ferromagnetic layer of the laminate; and a wiring that is in contact with a first side surface of the magnetic body and extends in a second direction crossing the first direction. The thickness of the second ferromagnetic layer in the first direction is thinner than the minimum length of the second ferromagnetic layer in a plane orthogonal to the first direction. The thickness of the magnetic body in the first direction is thicker than the minimum length of the magnetic body in a plane orthogonal to the first direction.

10 Claims, 13 Drawing Sheets

(56) References Cited

U.S. PATENT DOCUMENTS

| | | | |
|---|---|---|---|
| 11,854,589 B2* | 12/2023 | Guo | G11C 11/161 |
| 2006/0056223 A1 | 3/2006 | Ditewig et al. | |
| 2011/0129691 A1 | 6/2011 | Shiwata et al. | |
| 2014/0056060 A1 | 2/2014 | Khvalkovskiy et al. | |
| 2015/0041934 A1 | 2/2015 | Khvalkovskiy et al. | |
| 2015/0129995 A1 | 5/2015 | Wang et al. | |
| 2015/0200003 A1 | 7/2015 | Buhrman et al. | |
| 2015/0348606 A1 | 12/2015 | Buhrman et al. | |
| 2016/0020207 A1 | 1/2016 | Tsuchiya et al. | |
| 2017/0222135 A1 | 8/2017 | Fukami et al. | |
| 2018/0337326 A1* | 11/2018 | Sasaki | G11C 11/18 |
| 2019/0051820 A1 | 2/2019 | Sugiyama et al. | |
| 2019/0189516 A1 | 6/2019 | Sasaki et al. | |
| 2019/0355401 A1* | 11/2019 | Shiokawa | G11C 11/1675 |
| 2020/0006424 A1* | 1/2020 | Sato | H10N 50/80 |
| 2020/0035909 A1* | 1/2020 | Sun | H10N 52/101 |
| 2020/0136018 A1* | 4/2020 | Ying | H10N 50/01 |
| 2020/0203598 A1* | 6/2020 | Garello | H10N 50/85 |
| 2020/0212104 A1* | 7/2020 | Sonobe | H10N 50/85 |
| 2020/0227104 A1* | 7/2020 | Rahman | H10B 61/22 |
| 2020/0227105 A1* | 7/2020 | Gosavi | H10N 50/01 |
| 2020/0227626 A1* | 7/2020 | Lee | H10N 50/80 |

FOREIGN PATENT DOCUMENTS

| | | |
|---|---|---|
| JP | 5441005 B2 | 3/2014 |
| JP | 2016-021530 A | 2/2016 |
| JP | 2017-216286 A | 12/2017 |
| JP | 2019-033166 A | 2/2019 |
| JP | 6620915 B1 | 12/2019 |
| JP | 2020-107790 A | 7/2020 |
| WO | 2016/021468 A1 | 2/2016 |
| WO | 2017/090733 A1 | 6/2017 |
| WO | 2018/189964 A1 | 10/2018 |
| WO | 2019/171715 A1 | 9/2019 |

OTHER PUBLICATIONS

Miron et al.; "Perpendicular switching of a single ferromagnetic layer induced by in-plane current injection"; Nature; vol. 476; p. 189-193; 2011.

Liu et al.; "Spin torque switching with the giant spin Hall effect of tantalum"; Science; vol. 336; p. 1-19; 2012.

Liu et al.; "Current-Induced Switching of Perpendicularly Magnetized Magnetic Layers Using Spin Torque from the Spin Hall Effect"; Physical Review Letters; vol. 109; p. 096602-1 to 096602-5; 2012.

Lee et al.; "Threshold current for switching of a perpendicular magnetic layer induced by spin Hall effect"; Applied Physics Letters; vol. 102; p. 112410-1 to 112410-5; 2013.

Lee et al.; "Thermally activated switching of perpendicular magnet by spin-orbit spin torque"; Applied Physics Letters; vol. 104; p. 072413-1 to 072413-5; 2014.

Fukami et al.; Magnetization switching by spin-orbit torque in an antiferromagnet-ferromagnet bilayer system; Nature Materials; vol. 15; p. 535-541; 2016.

Fukami et al.; "A spin-orbit torque switching scheme with collinear magnetic easy axis and current configuration"; Nature Nanotechnology; vol. 11; p. 1-5; 2016.

Takahashi et al.; "Spin injection and detection in magnetic nanostructures"; Physical Review B; vol. 67; p. 052409-1 to 052409-4; 2003.

Seo et al.; "Area-Efficient SOT-MRAM With a Schottky Diode"; IEEE Electron Device Letters; vol. 37; p. 982-985; 2016.

Zhang et al.; "Spin Hall Effects in Metallic Antiferromagnets"; Physical Review Letters; vol. 113; p. 196602-1 to 196602-6; 2014.

Sato et al.; "Perpendicular-anisotropy CoFeB—MgO magnetic tunnel junctions with a MgO/CoFeB/Ta/CoFeB/MgO recording structure"; Applied Physics Letters; vol. 101; p. 022414-1 to 022414-4; 2012.

Liu et al.; "Magnetic Oscillations Driven by the Spin Hall Effect in 3-Terminal Magnetic Tunnel Junction Devices"; Physical Review Letters; vol. 109; p. 186602-1 to 186602-5; 2012.

Kimura et al.; "Electrical Control of the Direction of Spin Accumulation"; Physical Review Letters; vol. 99; p. 166601-1 to 166601-4; 2007.

Yu et al.; "Switching of perpendicular magnetization by spin-orbit torques in the absence of external magnetic fields"; Nature Nanotechnology; vol. 9; p. 548-554; 2014.

Seo, Y. and Kaushik, R.; High-Density SOT-MRAM Based on Shared Bitline Structure; IEEE Transactions on Very Large Scale Integration (VLSI) Systems; vol. 26; p. 1600-1603; 2018.

* cited by examiner

MAGNETORESISTANCE EFFECT ELEMENT AND MAGNETIC MEMORY

TECHNICAL FIELD

The present invention relates to a magnetoresistance effect element and a magnetic memory.

Priority is claimed on Japanese Patent Application No. 2020-148867, filed Sep. 4, 2020, the content of which is incorporated herein by reference.

BACKGROUND ART

A giant magnetoresistance (GMR) element formed of a multilayer film of ferromagnetic layers and non-magnetic layers and a tunnel magnetoresistance (TMR) element using the insulating layer (tunnel barrier layer, the barrier layer) in the non-magnetic layer are known as magnetoresistance effect elements. The magnetoresistance effect elements can be applied to magnetic sensors, radio frequency components, magnetic heads and non-volatile random access memories (MRAM).

The MRAM is a storage element into which a magnetoresistance effect element is integrated. The MRAM reads and writes data by using the property that the resistance of the magnetoresistance effect element changes in a case where the mutual magnetization directions of two ferromagnetic layers with a non-magnetic layer interposed therebetween in the magnetoresistance effect element changes.

For example, Patent Documents 1 and 2 each describe a method of changing the resistance of the magnetoresistance effect element by using spin-orbit torque (SOT). The SOT is induced by the spin current generated by spin-orbit interaction or the Rashba effect at the interface of dissimilar materials. The current for inducing SOT in the magnetoresistance effect element flows in a direction crossing the lamination direction of the magnetoresistance effect element. It is not necessary to pass a current in the lamination direction of the magnetoresistance effect element, and it is expected that the life of the magnetoresistance effect element will be extended.

CITATION LIST

Patent Literature

[Patent Document 1]
PCT International Publication No. WO2017/090733
[Patent Document 2]
Japanese Unexamined Patent Application, First Publication No. 2020-107790

SUMMARY OF INVENTION

Technical Problem

Patent Documents 1 and 2 each describe that wiring for giving spin-orbit torque to magnetization (spin-orbit torque wiring) is disposed so as to be in contact with the side surface of the magnetization free layer. However, the magnetoresistance effect element described in Patent Documents 1 and 2 cannot achieve both the point of reversing the magnetization even in the absence of a magnetic field and the point of increasing the MR ratio.

For example, in the magnetoresistance effect element described in Patent Document 1, the spin-orbit torque wiring is in contact with the side surface of the magnetization free layer which is thin in terms of the film thickness. Thus, the contact area between the spin-orbit torque wiring and the magnetization free layer is small. In a case where the contact area therebetween is small, sufficient spin cannot be supplied to the magnetization free layer. Therefore, it is not possible to provide a sufficient torque to reverse the magnetization only by the spin supplied from a side wall junction of the spin-orbit torque wiring. The spin supplied from the side wall junction also in Patent Document 1 is used for assisting the magnetization reversal, performing the magnetization reversal by the side wall junction alone is not described in Patent Document 1.

On the other hand, in the magnetoresistance effect element described in Patent Document 2, the thickness of the free layer is large, and the contact area between the free layer and the SOT generation source is large. However, there are only a limited number of materials that can increase the thickness of the free layer while maintaining perpendicular magnetic anisotropy. On the other hand, the materials of the magnetic body capable of exhibiting a large MR ratio are also limited. There are few magnetic bodies that satisfy the two characteristics at the same time, and the magnetoresistance effect element described in Patent Document 2 has a small MR ratio.

The present invention has been made in consideration of the above-mentioned circumstances, and an object of the present invention is to provide a magnetoresistance effect element and a magnetic memory having a large MR ratio and capable of reversing magnetization even in the absence of a magnetic field.

Solution to Problem

The present invention provides the following means for solving the above problems.

(1) The magnetoresistance effect element to the first aspect includes: a laminate in which a first ferromagnetic layer, a non-magnetic layer, and a second ferromagnetic layer are laminated in order in a first direction; a magnetic body that is present on the second ferromagnetic layer or above the second ferromagnetic layer of the laminate; and a wiring that is in contact with a first side surface of the magnetic body and extends in a second direction crossing the first direction. The thickness of the second ferromagnetic layer in the first direction is thinner than the minimum length of the second ferromagnetic layer in a plane orthogonal to the first direction. The thickness of the magnetic body in the first direction is thicker than the minimum length of the magnetic body in a plane orthogonal to the first direction.

(2) In the magnetoresistance effect element to the above-mentioned aspect, the wiring may be further in contact with an upper surface of the magnetic body.

(3) In the magnetoresistance effect element to the above-mentioned aspect, the wiring may be further in contact with a first side surface of the second ferromagnetic layer.

(4) In the magnetoresistance effect element to the above-mentioned aspect, a direction of easy magnetization axis of the magnetic body and the second ferromagnetic layer may be the first direction.

(5) In the magnetoresistance effect element to the above-mentioned aspect, the second ferromagnetic layer and the magnetic body may be composed of a different material or have a different composition.

(6) In the magnetoresistance effect element to the above-mentioned aspect, the magnetic body may include two or more elements selected from the group consisting of Co, Tb, Fe, and Gd.

(7) In the magnetoresistance effect element to the above-mentioned aspect, a lower surface of the magnetic body may be larger than an upper surface of the second ferromagnetic layer, and a step may be formed at an interface between the first side surface of the magnetic body and the first side surface of the second ferromagnetic layer.

(8) The magnetoresistance effect element to the above-mentioned aspect may further include an intermediate layer between the second ferromagnetic layer and the magnetic body.

(9) The magnetoresistance effect element to the above-mentioned aspect may further include a second wiring and an insulating layer which are present between the magnetic body and the second ferromagnetic layer. The second wiring may be in contact with the second ferromagnetic layer, and the insulating layer may be interposed between the second wiring and the magnetic body.

(10) The magnetoresistance effect element to the above-mentioned aspect may further include an oxide layer that is in contact with an upper surface of the magnetic body.

(11) The magnetic memory according to a second aspect includes a plurality of the magnetoresistance effect elements according to the above-mentioned aspect.

Advantageous Effects of Invention

The magnetoresistance effect element and the magnetic memory according to the present embodiment each have a large MR ratio and are able to reverse the magnetization even in the absence of the magnetic field.

DESCRIPTION OF EMBODIMENTS

Figure 1:
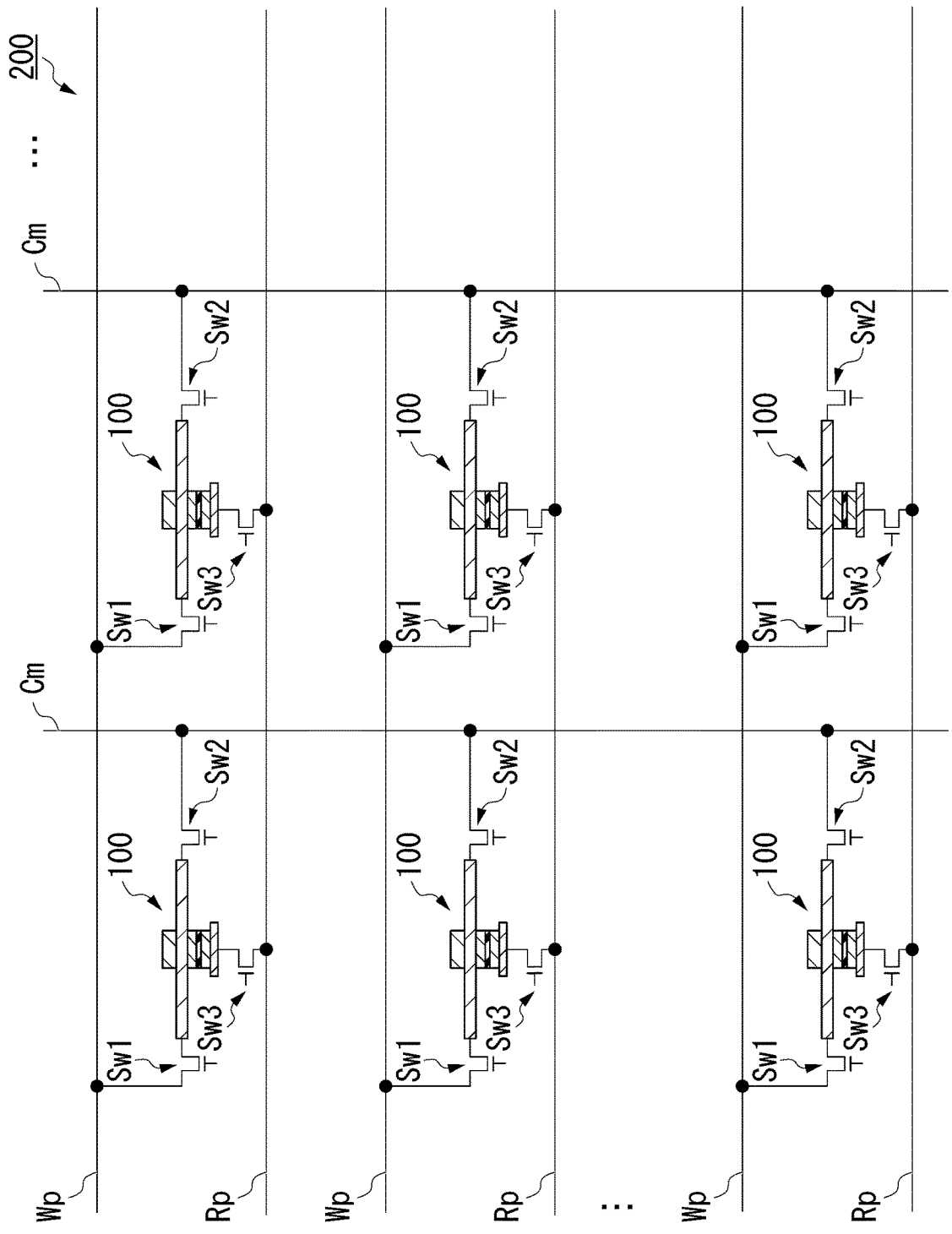
FIG. 1 is a schematic diagram showing a magnetic recording array according to a first embodiment.

The present embodiment will be hereinafter described in detail with reference to the drawings as appropriate. In the drawings used in the following description, the characteristic parts may be enlarged for convenience to make the characteristic easy to understand, and the dimensional ratio of each component may be different from the actual one. The materials, dimensions, and the like in the following description are exemplary examples, and the present invention is not limited thereto, and can be appropriately modified and performed within the range in which the effects of the present invention are exhibited.

First, the directions are defined. One direction of one surface of the substrate Sub (refer to FIG. 2) to be described later is defined as the x direction, and the direction orthogonal to the x direction is defined as the y direction. The x direction is, for example, the direction in which the wiring 30 extends. The z direction is a direction which is orthogonal to the x direction and the y direction. The z direction is an example of the lamination direction. Hereinafter, the +z direction may be represented as "upper side" and the −z direction may be represented as "lower side". The upper and lower sides do not always coincide with the direction in which gravity is applied.

In the present specification, the term "extending in the x direction" means that, for example, the dimension in the x direction is larger than the smallest dimension among the dimensions in the x direction, the y direction, and the z direction. It is the same in the case of extending in other directions. Further, in the present specification, the term "connected" is not limited to a case of being physically connected. For example, the term "connected" includes not only a case where the two layers are physically in contact with each other, but also a case where the two layers are connected with another layer therebetween. The term "connected" also includes a case where the two members are electrically connected.

First Embodiment

FIG. 1 is a configuration diagram showing the magnetic recording array 200 according to the first embodiment. The magnetic recording array 200 includes a plurality of magnetoresistance effect elements 100, a plurality of write wiring Wp, a plurality of common wiring Cm, a plurality of read wiring Rp, a plurality of first switching elements Sw1, a plurality of second switching elements Sw2, and a plurality of third switching elements Sw3. The magnetic recording array 200 can be used for, for example, a magnetic memory.

The respective write wirings Wp electrically connect the power supply and one or more magnetoresistance effect elements 100. Each common wirings Cm is a wiring used both when writing data and when reading data. The common wirings Cm electrically connect the reference potential and one or more magnetoresistance effect elements 100. The reference potential is, for example, ground. The common wiring Cm may be provided in each of the plurality of magnetoresistance effect elements 100, and may be provided throughout the plurality of magnetoresistance effect elements 100. The respective read wirings Rp electrically connect the power supply and one or more magnetoresistance effect elements 100. The power supply is connected to the magnetic recording array 200 in use.

The first switching element Sw1, the second switching element Sw2, and the third switching element Sw3 each are connected to, for example, one magnetoresistance effect element 100. The first switching element Sw1 is connected between the magnetoresistance effect element 100 and the write wiring Wp. The second switching element Sw2 is connected between the magnetoresistance effect element 100 and the common wiring Cm. The third switching element Sw3 is connected between the magnetoresistance effect element 100 and the read wiring Rp.

In a case where the predetermined first switching element Sw1 and the second switching element Sw2 are turned on, a write current flows between the write wiring Wp connected to the predetermined magnetoresistance effect element 100 and the common wiring Cm. In a case where the predetermined second switching element Sw2 and the third switching element Sw3 are turned on, a read current flows between the common wiring Cm connected to the predetermined magnetoresistance effect element 100 and the read wiring Rp.

The first switching element Sw1, the second switching element Sw2, and the third switching element Sw3 are elements which control the flow of current. The first switching element Sw1, the second switching element Sw2, and the third switching element Sw3 are, for example, a transistor, an element such as an ovonic threshold switch (OTS) using the phase change of the crystal layer, an element such as a metal insulator transition (MIT) switch using a change in band structure, an element such as a Zener diode and an avalanche diode using a breakdown voltage, and an element of which the conductivity changes as the atomic position changes.

Any one of the first switching element Sw1, the second switching element Sw2, and the third switching element Sw3 may be shared by the magnetoresistance effect element 100 connected to the same wiring. For example, in a case where the first switching element Sw1 is shared, one first switching element Sw1 is provided upstream of the write wiring Wp. For example, in a case where the second switching element Sw2 is shared, one second switching element Sw2 is provided upstream of the common wiring Cm. For example, in a case where the third switching element Sw3 is shared, one third switching element Sw3 is provided upstream of the read wiring Rp.

Figure 2:
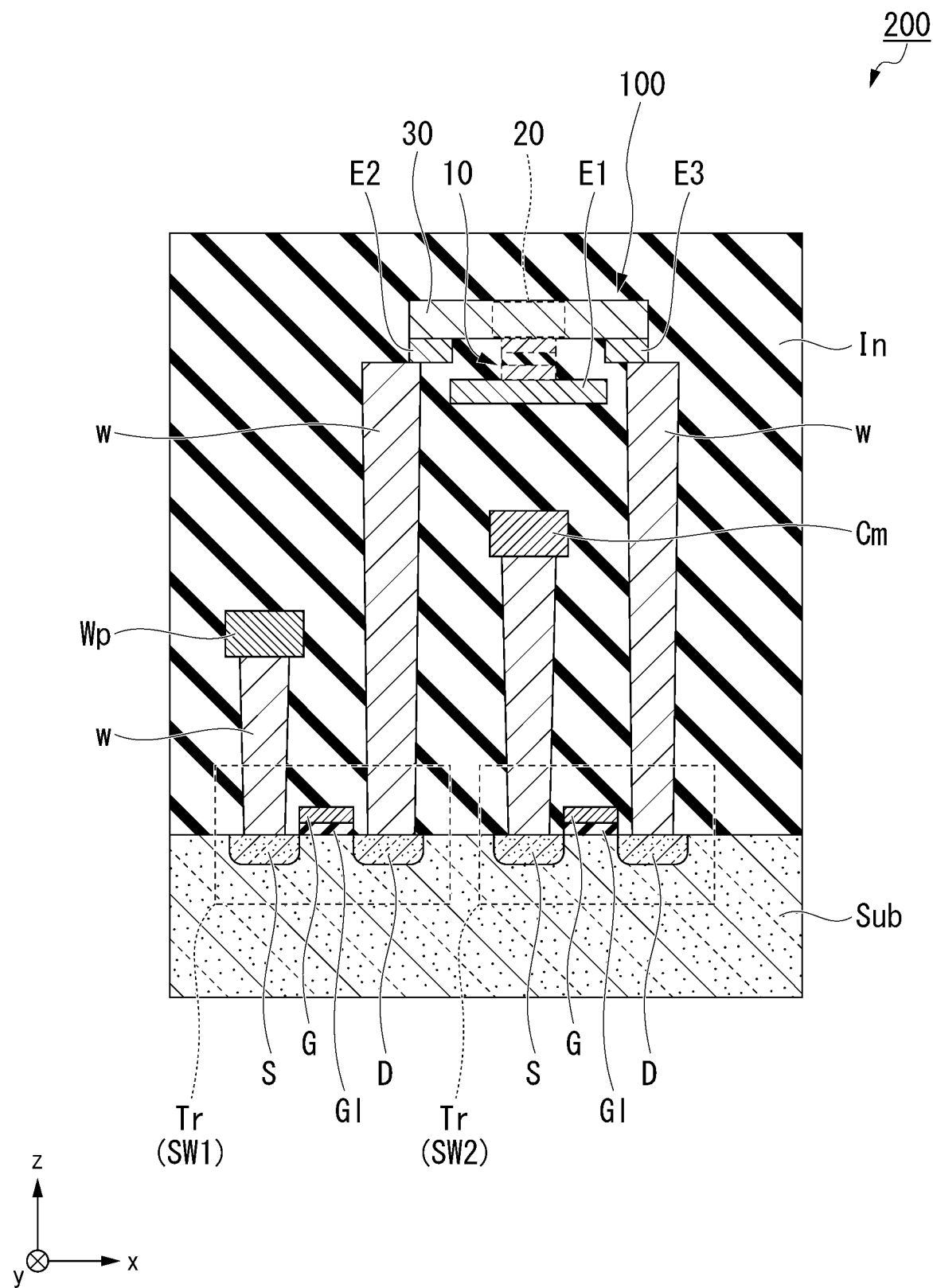
FIG. 2 is a cross-sectional view showing the magnetic recording array according to the first embodiment.

FIG. 2 is a cross-sectional view showing a characteristic part of the magnetic recording array 200 according to the first embodiment. FIG. 2 shows a cross section of the magnetoresistance effect element 100 cut along an xz plane passing through the center of the width of the wiring 30 to be described later in the y direction. Since the laminate 10 and the magnetic body 20 are present in the y direction (paper surface depth direction) from the wiring 30, they are shown by dotted lines.

The first switching element Sw1 and the second switching element Sw2 which are shown in FIG. 2 are transistors Tr. The third switching element Sw3 is electrically connected to the electrode E1 and is positioned, for example, in the y direction of FIG. 2. The transistor Tr is, for example, a field effect transistor, and has a gate electrode G, a gate insulating film GI, and a source S and a drain D formed on the substrate Sub. The substrate Sub is, for example, a semiconductor substrate.

The transistor Tr and the magnetoresistance effect element 100 are electrically connected through the wiring w and the electrodes E1 and E2. Further, the transistor Tr and the write wiring Wp or the common wiring Cm are connected through the wiring w. The wiring w may be referred to as, for example, a connection wiring, a via wiring, or an interlayer wiring. The wiring w and the electrodes E2 and E3 each include a conductive material. The wiring w extends, for example, in the z direction.

An insulator In covers the periphery of the magnetoresistance effect element 100 and the transistor Tr. The insulator In is an insulator that performs insulation between the wirings and the elements of the multilayer wiring. The insulator In is, for example, silicon oxide ($SiO_x$), silicon nitride ($SiN_x$), silicon carbide (SiC), chromium nitride, silicon carbide (SiCN), silicon oxynitride (SiON), aluminum oxide. ($Al_2O_3$), zirconium oxide ($ZrO_x$), or the like.

Figure 3:
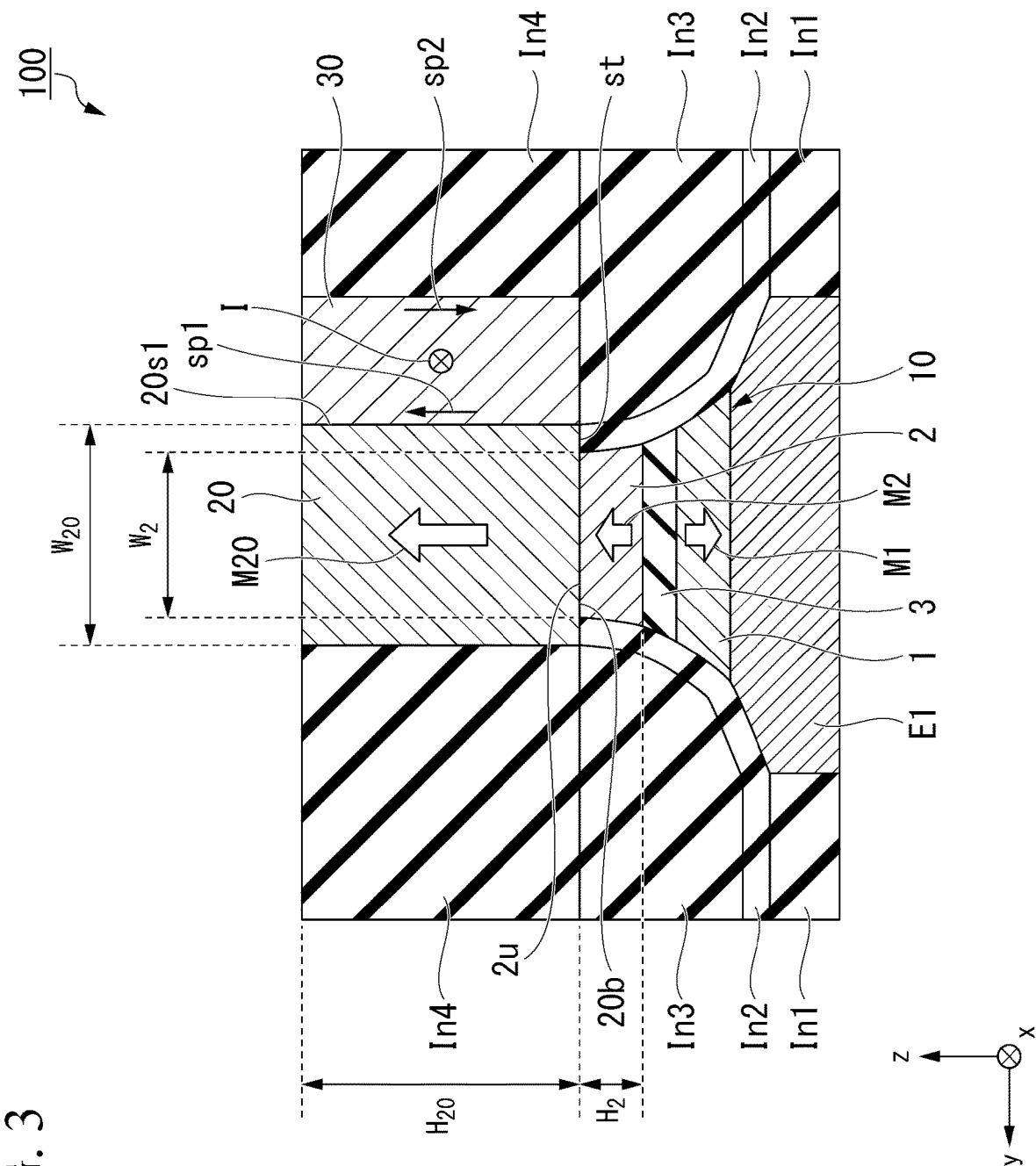
FIG. 3 is a cross-sectional view showing a characteristic part of the magnetic recording array according to the first embodiment.
Figure 4:
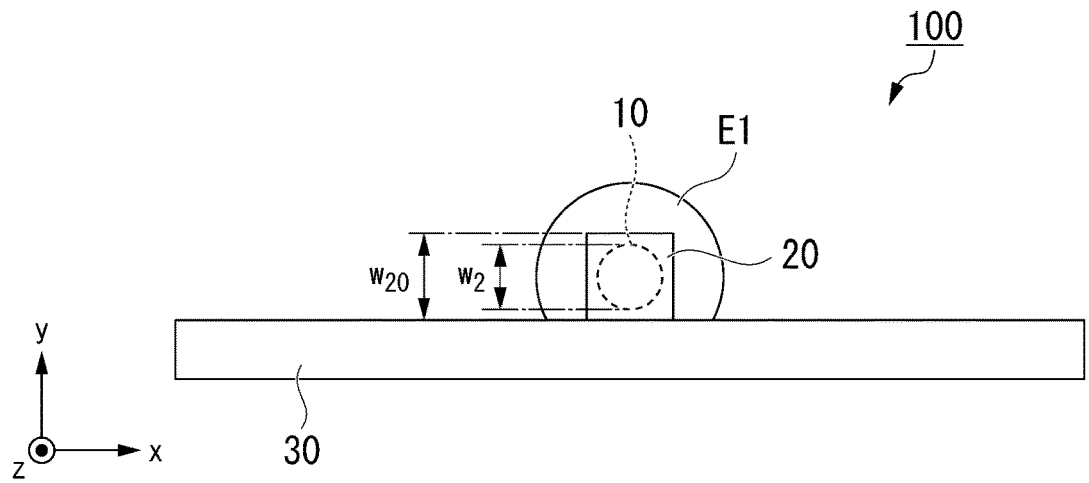
FIG. 4 is a plan view showing a characteristic part of the magnetic recording array according to the first embodiment.

FIG. 3 is a cross-sectional view showing a characteristic part of the magnetic recording array 200 according to the first embodiment. FIG. 3 shows a cross section of the magnetoresistance effect element 100 cut in the yz plane. FIG. 4 is a plan view showing the magnetoresistance effect element 100 according to the first embodiment as viewed from the z direction.

The magnetoresistance effect element 100 has, for example, a laminate 10, a magnetic body 20, and wiring 30. The insulating layers In1, In2, In3, and In4 are a part of the insulator In. The magnetoresistance effect element 100 may be a magnetic element using spin-orbit torque (SOT), and may be referred to as a spin-orbit torque type magnetoresistance effect element, a spin injection type magnetoresistance effect element, or a spin current magnetoresistance effect element.

The laminate 10 has a first ferromagnetic layer 1, a non-magnetic layer 3, and a second ferromagnetic layer 2 in this order from the side closer to the substrate Sub. The laminate 10 is laminated on the electrode E1. The laminate 10 is interposed between the magnetic body 20 and the electrode E1 in the z direction. The laminate 10 is a columnar body. The laminate 10 gradually widens from the upper surface to the lower surface. The plan view shape of the laminate 10 from the z direction is, for example, a circle, an ellipse, or a quadrangle.

The first ferromagnetic layer 1 has a magnetization M1, and the second ferromagnetic layer 2 has a magnetization M2. The orientation direction of the magnetization M1 of the first ferromagnetic layer 1 is less likely to change than that of the magnetization M2 of the second ferromagnetic layer 2 in a case where a predetermined external force is applied. The first ferromagnetic layer 1 is referred to as a magnetization fixed layer and a magnetization reference layer, and the second ferromagnetic layer 2 is referred to as a magnetization free layer. The laminate 10 has a bottom pin structure where the magnetization fixed layer is present on the substrate Sub side. The bottom pin structure has higher magnetization stability than the top pin structure where the magnetization fixed layer is positioned away from the substrate Sub from the magnetization free layer. The resistance value of the laminate 10 changes in accordance with the difference in the relative angle between the magnetization M1 of the first ferromagnetic layer 1 and the magnetization M2 of the second ferromagnetic layer 2 with the non-magnetic layer 3 interposed therebetween.

The first ferromagnetic layer 1 and the second ferromagnetic layer 2 each include a ferromagnetic body. The ferromagnetic body is, for example, a metal selected from the group consisting of Cr, Mn, Co, Fe and Ni, an alloy including at least one of these metals, and an alloy including at least one of these metals and B, C, and N, or the like. The ferromagnetic body is, for example, Co—Fe, Co—Fe—B, Ni—Fe, Co—Ho alloy, Sm—Fe alloy, Fe—Pt alloy, Co—Pt alloy, or CoCrPt alloy.

The first ferromagnetic layer 1 and the second ferromagnetic layer 2 each may include a Heusler alloy. The Heusler alloy includes intermetallic compounds with a chemical composition of XYZ or $X_2YZ$. X is a transition metal element or noble metal element of Group Co, Fe, Ni, or Cu on the periodic table, Y is a transition metal of Group Mn, V, Cr, or Ti or an elemental species of X, and Z is a typical element of groups III to V. The Heusler alloy is, for example, $Co_2FeSi$, $Co_2FeGe$, $Co_2FeGa$, $Co_2MnSi$, $Co_2Mn_{1-a}Fe_aAl_bSi_{1-b}$, $Co_2FeGe_{1-c}Ga_c$, or the like. The Heusler alloy has a high spin polarizability.

For example, the magnetization M1 of the first ferromagnetic layer 1 and the magnetization M2 of the second ferromagnetic layer 2 are oriented in the z direction. The first ferromagnetic layer 1 and the second ferromagnetic layer 2 are perpendicular magnetization films having an axis of easy magnetization and the axis direction coincides with in the z direction (the first direction).

The film thickness $H_2$ of the second ferromagnetic layer 2 is thinner than the minimum length $W_2$ within the xy plane of the second ferromagnetic layer 2. The film thickness $H_2$ of the second ferromagnetic layer 2 is, for example, 10 nm or less, and the minimum length $W_2$ of the second ferromagnetic layer 2 is, for example, greater than 10 nm. In a similar manner to the second ferromagnetic layer 2, the first ferromagnetic layer 1 also has a film thickness thinner than the minimum length within the xy plane.

The laminate 10 may have a layer other than the first ferromagnetic layer 1, the non-magnetic layer 3, and the second ferromagnetic layer 2. For example, a spacer layer and a third ferromagnetic layer may be provided on the surface of the first ferromagnetic layer 1 opposite to the non-magnetic layer 3. The magnetic coupling between the first ferromagnetic layer 1 and the third ferromagnetic layer improves the stability of the magnetization M1 of the first ferromagnetic layer 1. The first ferromagnetic layer, the spacer layer, and the third ferromagnetic layer have a synthetic antiferromagnetic structure (SAF structure). As the third ferromagnetic layer, it is possible to use the same material as that of the first ferromagnetic layer 1. It is preferable that the third ferromagnetic layer is, for example, a perpendicular magnetization film formed only of a magnetic film such as Co/Ni or Co/Pt or a multilayer film of a magnetic film and a non-magnetic film. The spacer layer includes, for example, at least one selected from the group consisting of Ru, Ir, and Rh. Further, an underlayer may be provided on the lower surface of the first ferromagnetic layer 1. The underlayer improves the crystallinity of each layer constituting the laminate 10.

The magnetic body 20 is positioned at the position of the laminate 10 in the z direction. The magnetic body 20 is, for example, on the laminate 10. The magnetic body 20 is present on the second ferromagnetic layer 2 and is magnetically coupled to the second ferromagnetic layer 2. The magnetic coupling may be ferromagnetic coupling or antiferromagnetic coupling.

The magnetic body 20 includes a ferromagnetic body. For example, the magnetization M20 of the magnetic body 20 is oriented in the z direction. The magnetic body 20 is a perpendicular magnetization film of which direction of easy magnetization axis is the z direction (the first direction).

The magnetic body 20 includes a material having crystalline magnetic anisotropy in the z direction. The magnetic body 20 is different in material or composition from, for example, the second ferromagnetic layer 2. In other words, each of the second ferromagnetic layer 2 and the magnetic body 20 is made of a material or a composition different from each other. The crystalline magnetic anisotropy is a tendency to orient magnetization, which is caused by the crystal structure of the magnetic body, in a particular direction. The crystalline magnetic anisotropy occurs since the electronic structure of the crystal differs depending on the crystal orientation. The magnetic body 20 has, for example, a tetragonal structure in which the c-axis is oriented in the z direction.

The magnetic body 20 may be, for example, only a magnetic film such as Co/Ni or Co/Pt or a multilayer film including a magnetic film and a non-magnetic film.

The magnetic body 20 includes, for example, two or more elements selected from the group consisting of Co, Tb, Fe, and Gd. The magnetic body 20 is, for example, GdFeCo or TbFeCo. The magnetic body 20 may be, for example, a PtFe alloy, a PtCo alloy, a PdFe alloy, a FeNi alloy, an MnGa alloy, or an MnGe alloy.

The thickness $H_{20}$ of the magnetic body 20 in the z direction is thicker than the minimum length $W_{20}$ within the xy plane of the magnetic body 20. In a case where the magnetic body 20 extends in the z direction, the magnetic body 20 has a shape magnetic anisotropy in the z direction, and the magnetization M20 is strongly oriented in the z direction. The shape magnetic anisotropy is a tendency to orient the magnetization, which is caused by the shape of the magnetic body 20, in a specific direction. The magnetic body 20 has anisotropy in shape, and the magnitude of the demagnetizing field differs between the major axis direction and the minor axis direction. The magnetization M20 of the magnetic body 20 tends to be oriented in the major axis direction of the magnetic body 20 having a weak demagnetizing field.

The magnetic body 20 is, for example, larger than the second ferromagnetic layer 2 in a plan view from the z direction. The lower surface 20b of the magnetic body 20 is, for example, larger than the upper surface 2u of the second ferromagnetic layer 2. A step st is formed at the interface between the magnetic body 20 and the second ferromagnetic layer 2. Specifically, the step st is formed at the interface between the first side surface of the magnetic body 20 and the first side surface of the second ferromagnetic layer 2.

The wiring 30 is connected to the first side surface 20s1 of the magnetic body 20. The wiring 30 is connected to, for example, only the first side surface 20s1 of the plurality of side surfaces of the magnetic body 20. Another layer having a film thickness equal to or less than the spin diffusion length may be provided between the wiring 30 and the magnetic body 20. The wiring 30 extends, for example, in the x direction.

The wiring 30 generates a spin current by the spin Hall effect in a case where the current i flows, and injects spin into the magnetic body 20. The wiring 30 is referred to as a spin-orbit torque wiring. The wiring 30 gives, for example, a spin-orbit torque (SOT), which is sufficient to reverse the magnetization M20 of the magnetic body 20, to the magnetization M20 of the magnetic body 20. The spin Hall effect is a phenomenon in which a spin current is induced in a direction orthogonal to the direction in which a current flows, based on the spin-orbit interaction in a case where a current is passed. The spin Hall effect is common to the normal Hall effect in that moving (flowing) charge (electrons) is capable of deflecting the moving (flowing) direction. In the normal Hall effect, the direction of movement of charged particles moving in a magnetic field is deflected by the Lorentz force. On the other hand, in the spin Hall effect, even in the absence of a magnetic field, the direction of spin movement is deflected only by the movement of electrons (only the flow of current).

For example, in a case where a current flows through the wiring 30, the first spin sp1, which is oriented in one direction, and the second spin sp2, which is oriented in a direction opposite to the first spin sp1, can be deflected by the spin Hall effect in directions orthogonal to the direction in which the current I flows. For example, the first spin sp1 oriented in the +z direction is directed toward the −y direction, and the second spin sp2 oriented in the −z direction is directed toward the +y direction.

In a non-magnetic body (a material that is not a ferromagnetic body), the number of electrons in the first spin sp1 and the number of electrons in the second spin sp2 generated by the spin Hall effect are equal. That is, the number of electrons in the first spin sp1 in the −y direction is equal to the number of electrons in the second spin sp2 in the +y direction. The first spin sp1 and the second spin sp2 flow in the direction of reducing the uneven distribution of spins. In the movement of the first spin sp1 and the second spin sp2 in the y direction, the charge flows cancel each other out. Therefore, the amount of current becomes zero. A spin current without a current is particularly called a pure spin current.

Assuming that the flow of electrons of the first spin sp1 is $J_\uparrow$ and the flow of electrons of the second spin sp2 is $J_\downarrow$, the spin current $J_S$ is defined by $J_S=J_\uparrow-J_\downarrow$. The spin current $J_S$ occurs in the y direction.

The wiring 30 includes any one of a metal, an alloy, an intermetalic compound, a metal boride, a metal carbide, a metal siliceate, and a metal phosphate, each of which has a function of generating a spin current by the spin Hall effect generated in a case where the current I flows.

The wiring 30 includes, for example, a non-magnetic heavy metal as a main component. The heavy metal means a metal having a specific density of yttrium (Y) or more. The non-magnetic heavy metal is, for example, a non-magnetic metal having a d-electron or an f-electron in the outermost shell and having a large atomic number which is an atomic number of 39 or more. The wiring 30 is made of, for example, Hf, Ta, or W. The non-magnetic heavy metals have stronger spin-orbit interaction than other metals. The spin Hall effect is generated by the spin-orbit interaction. Thus, the spins are likely to be unevenly distributed in the wiring 30, and the spin current $J_S$ is likely to be generated.

The wiring 30 includes, for example, at least one selected from the group consisting of Ta, W, Pt, Au, Nb, Mo, Ru, Os, Rh, Ir, Pd, and Ag. The wiring 30 is made of, for example, a single metal of these elements. The elements are excellent in thermal conductivity, and heat dissipation of the magnetoresistance effect element 100 is improved.

The wiring 30 may also include a magnetic metal. The magnetic metal is a ferromagnetic metal or an antiferromagnetic metal. A small amount of magnetic metal included in the non-magnetic body becomes a scattering factor of the spin. The small amount is, for example, 3% or less of the total mole ratio of the elements constituting the wiring 30. In a case where the spins are scattered by the magnetic metal, the spin-orbit interaction is enhanced. As a result, the efficiency of generation of the spin current relative to the current is increased.

The wiring 30 may include a topological insulator. A topological insulator is a body of which the inside is an insulator or a high resistive element but the surface is in a metallic state where spin polarization occurs. In topological insulator, an internal magnetic field is generated by the spin-orbit interaction. The topological insulator develop a new topological phase due to the effect of spin-orbit interaction even in the absence of an external magnetic field. The topological insulator is able to generate pure spin current with high efficiency due to strong spin-orbit interaction and breaking of reversal symmetry at the edges.

The topological insulator is, for example, SnTe, $Bi_{1.5}Sb_{0.5}Te_{1.7}Se_{1.3}$, $TlBiSe_2$, $Bi_2Te_3$, $Bi_{1-x}Sb_x$, $(Bi_{1-x}Sb_x)_2Te_3$, or the like. The topological insulator is able to generate spin currents with high efficiency.

Next, a method of manufacturing the magnetoresistance effect element 100 will be described. The magnetoresistance effect element 100 is formed by a laminating step of each layer and a processing step of processing a part of each layer into a predetermined shape. For the lamination of each layer, it is possible to use a sputtering method, a chemical vapor deposition (CVD) method, an electron beam vapor deposition method (EB vapor deposition method), an atomic laser deposition method, or the like. The processing of each layer can be performed using photolithography or the like.

Figure 5:
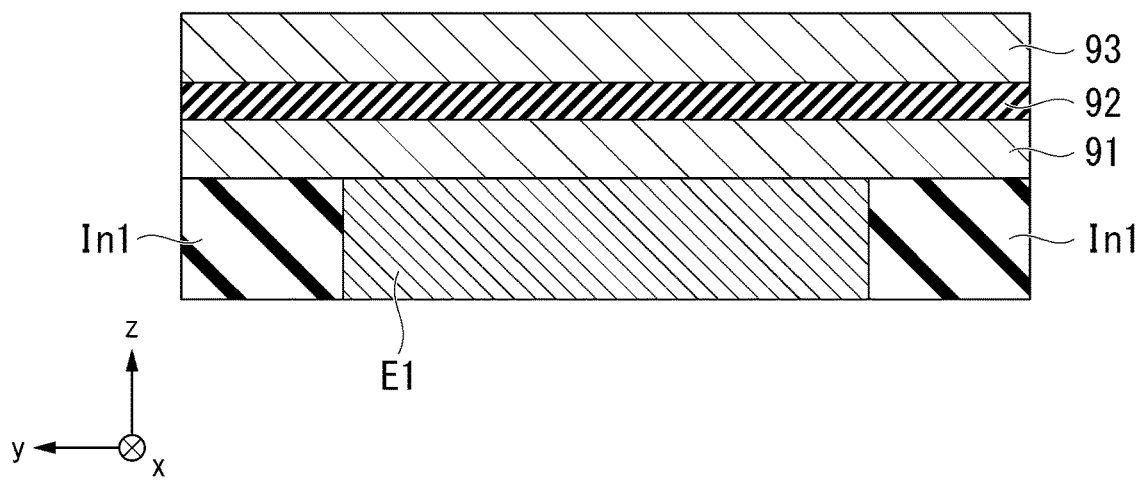
FIG. 5 is a cross-sectional view showing an example of a manufacturing process of the magnetic recording array according to the first embodiment.

First, as shown in FIG. 5, the ferromagnetic layer 91, the non-magnetic layer 92, and the ferromagnetic layer 93 are laminated, in this order, on the insulator In and the electrode E1. The lamination surface of the insulator In and the electrode E1 is flattened by, for example, chemical mechanical polishing (CMP).

Figure 6:
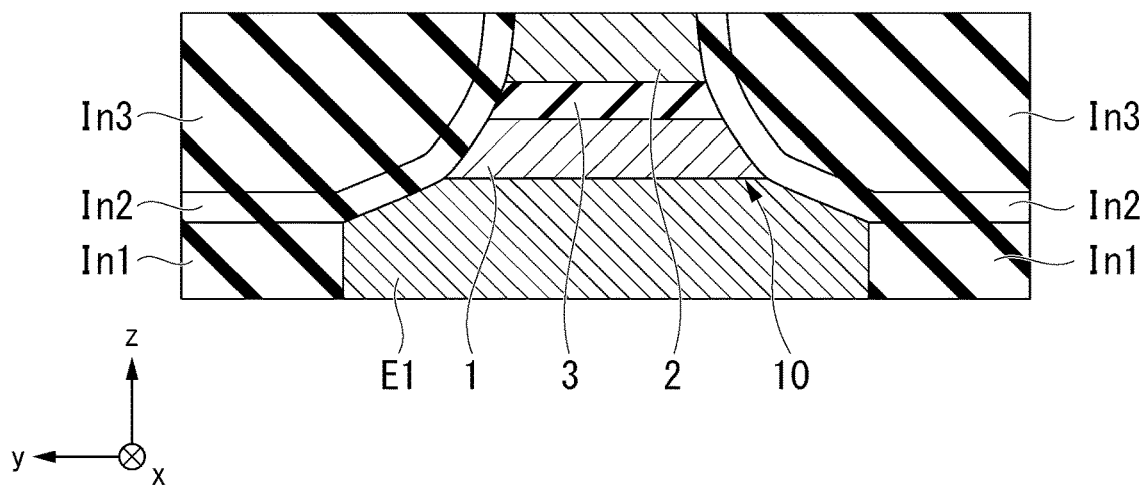
FIG. 6 is a cross-sectional view showing an example of a manufacturing process of the magnetic recording array according to the first embodiment.

Next, as shown in FIG. 6, the ferromagnetic layer 91, the non-magnetic layer 92, and the ferromagnetic layer 93 each are processed into a predetermined shape. Through the processing, the ferromagnetic layer 91 is turned into the first ferromagnetic layer 1, the non-magnetic layer 92 is turned into the non-magnetic layer 3, and the ferromagnetic layer 93 is turned into the second ferromagnetic layer 2. As a result, the laminate 10 is obtained. After that, the insulating layer In2 and the insulating layer In3 are laminated, in this order, on the laminate 10. Then, a part of the insulating layer In2 and the insulating layer In3 laminated on the laminate 10 is removed by chemical mechanical polishing. Thereby, the second ferromagnetic layer 2 is exposed.

Figure 7:
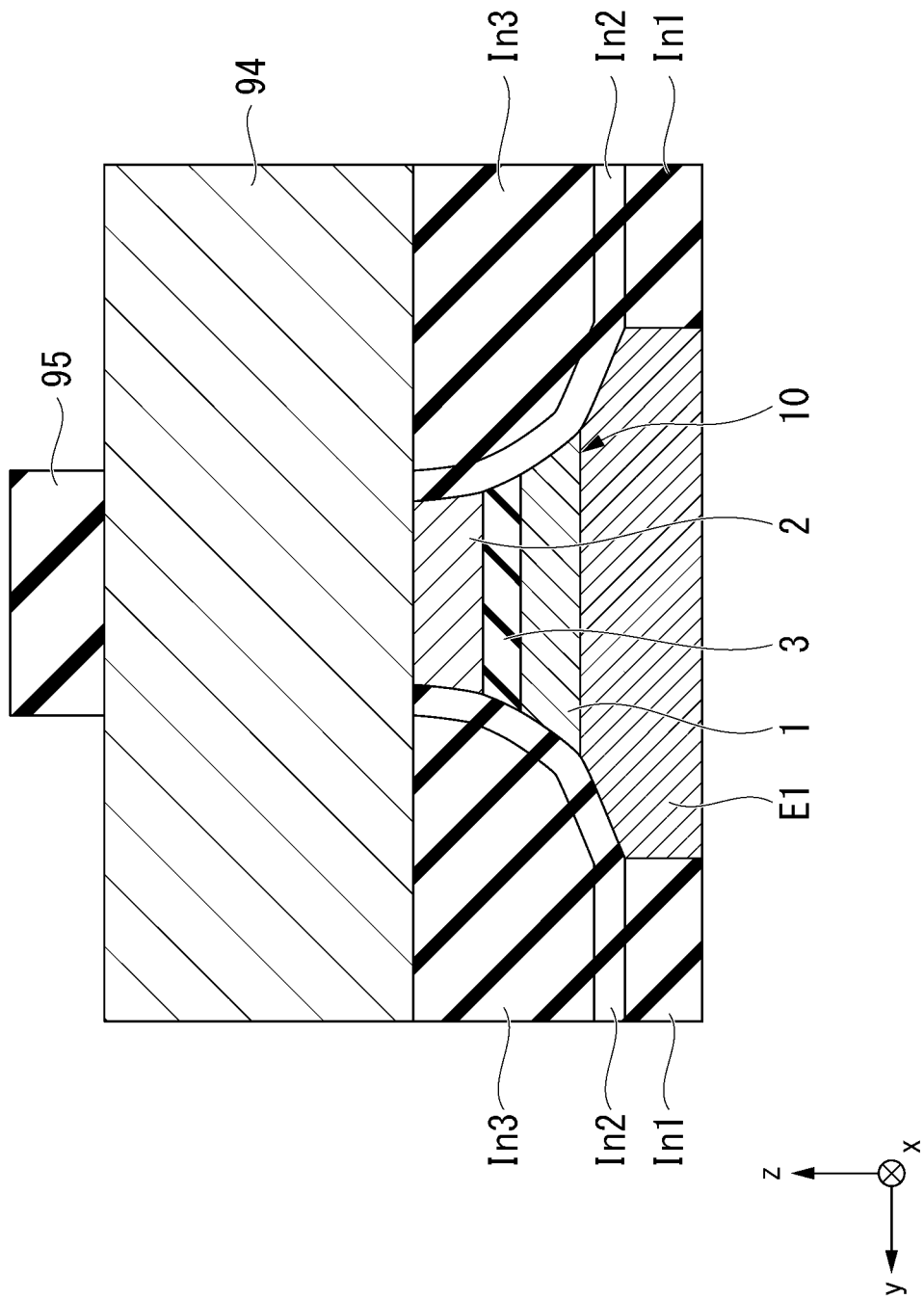
FIG. 7 is a cross-sectional view showing an example of a manufacturing process of the magnetic recording array according to the first embodiment.

Next, as shown in FIG. 7, the magnetic body 94 is laminated on the insulating layer In3 and the second ferromagnetic layer 2. Then, the mask layer 95 is laminated at a predetermined position of the magnetic body 94. A material of the mask layer 95 is, for example, Ta or W.

Figure 8:
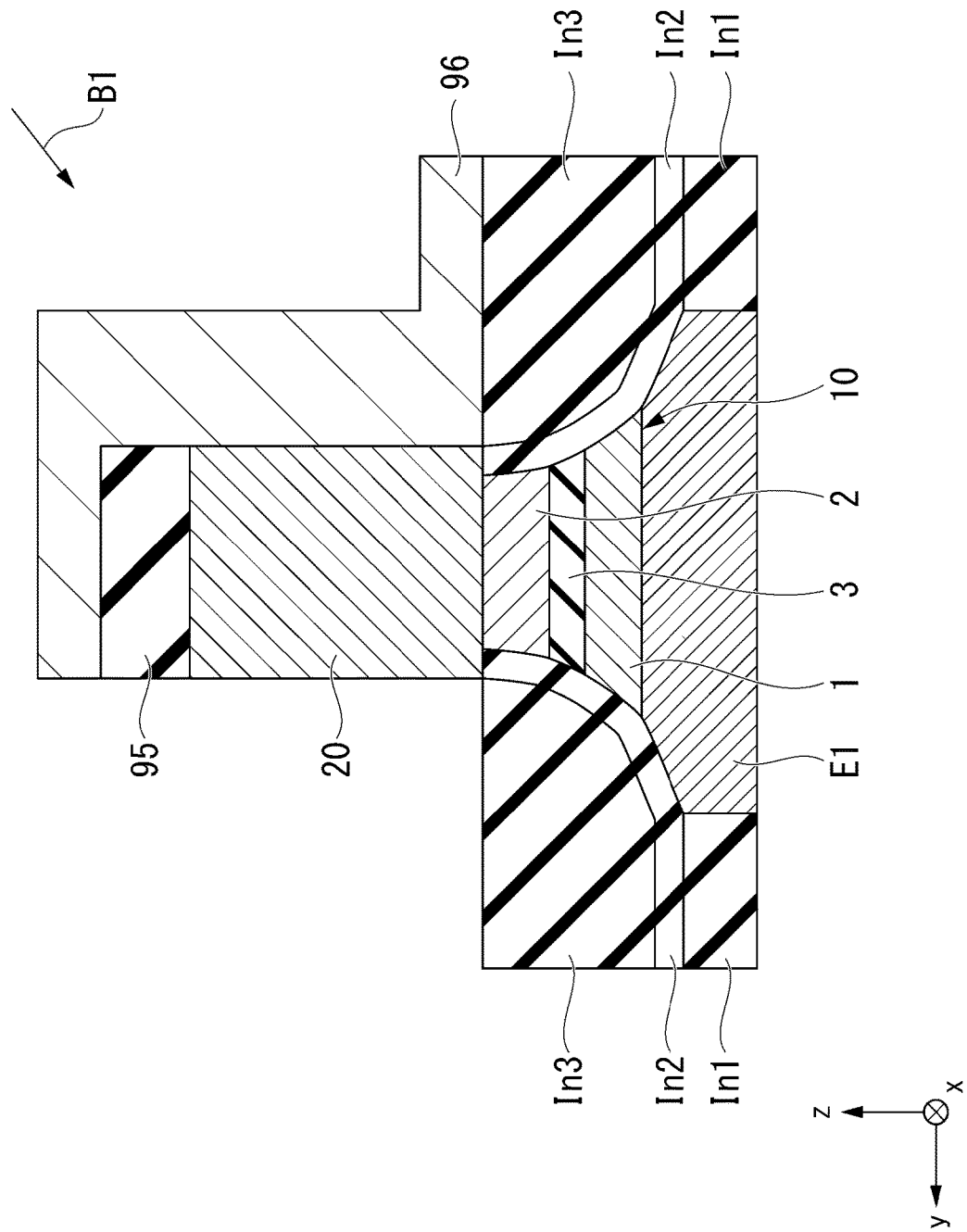
FIG. 8 is a cross-sectional view showing an example of a manufacturing process of the magnetic recording array according to the first embodiment.

Next, as shown in FIG. 8, the magnetic body 94 is processed through the mask layer 95 to form the magnetic body 20. Then, for example, the ion beam deposition (IBD) method is used to illuminate the ion beam B1 from an oblique direction inclined with respect to the z direction to form a conductive layer 96 on the magnetic body 20. The conductive layer 96 is formed on one side surface of the magnetic body 20 by using the shadow effect.

Figure 9:
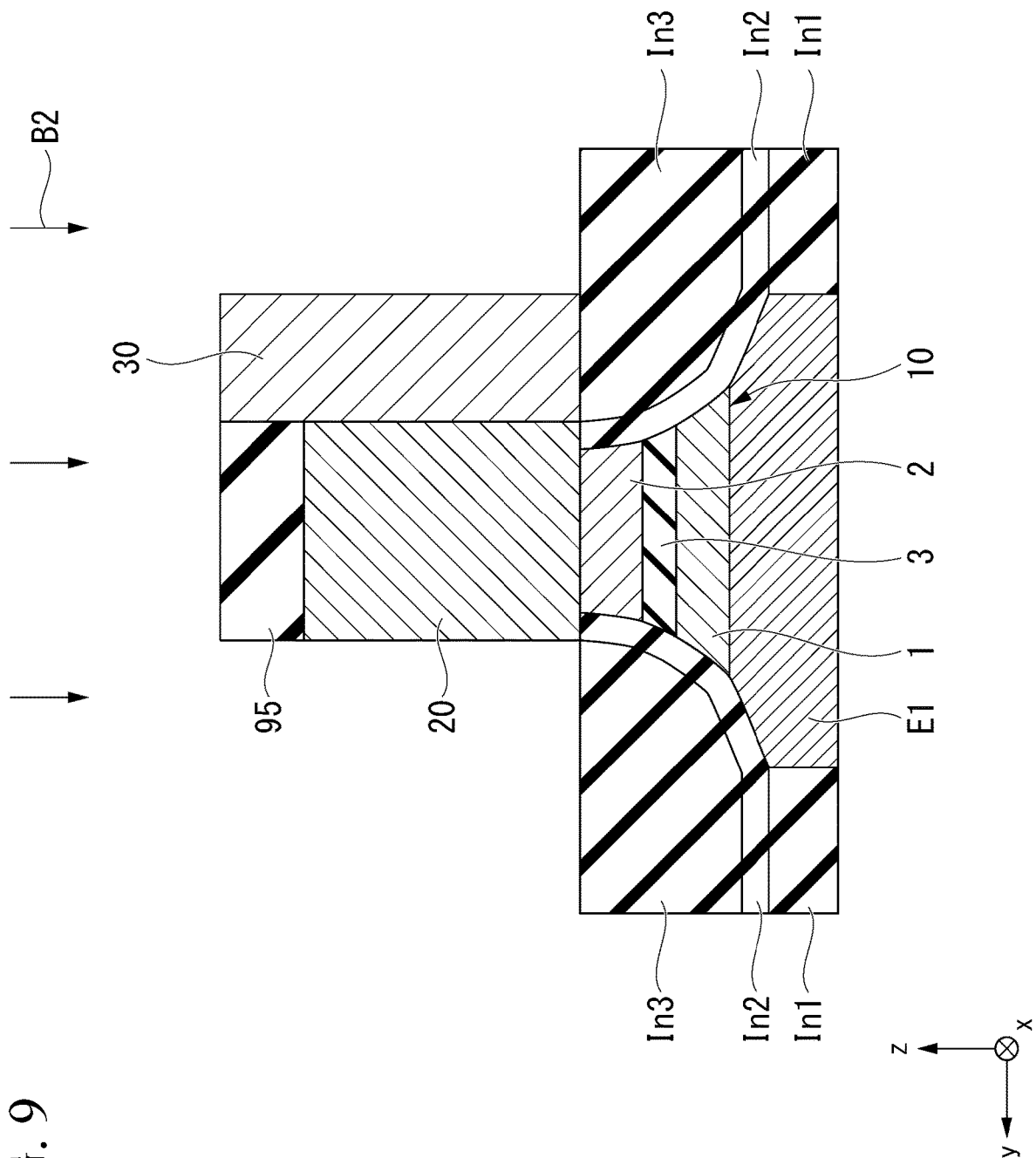
FIG. 9 is a cross-sectional view showing an example of a manufacturing process of the magnetic recording array according to the first embodiment.

Next, as shown in FIG. 9, the ion beam B2 is illuminated from the z direction, thereby etching a part of the conductive layer 96. The unnecessary portion of the conductive layer 96 is removed by ion beam etching (IBE), thereby obtaining the wiring 30. After that, the insulating layer In4 is formed around the magnetic body 20 and the wiring 30, and the mask layer 95 is removed by chemical mechanical polishing (CMP), thereby obtaining the magnetoresistance effect element 100.

Next, the operation of the magnetoresistance effect element 100 will be described. The magnetoresistance effect element 100 performs a writing operation and a reading operation.

The operation of writing data to the magnetoresistance effect element 100 will be described. First, the first switching element Sw1 and the second switching element Sw2, which are connected to the magnetoresistance effect element 100 to which data is to be written, are turned on. In a case where the first switching element Sw1 and the second switching element Sw2 are turned on, a current I flows through the wiring 30.

In a case where the current I flows through the wiring 30, the first spin sp1 is injected into the magnetic body 20 due to the spin Hall effect. The magnetization M20 of the magnetic body 20 is reversed by receiving the spin-orbit torque generated by injecting the first spin sp1. The behavior of reversing the magnetization M20 of the magnetic body 20 differs depending on the orientation direction of the spins injected into the magnetic body 20. In a case where the orientation direction of the magnetization M20 of the magnetic body 20 and the orientation direction of the first spin sp1 are in parallel or antiparallel relationship, a torque for rotating the magnetization M20 by 180° is applied. Therefore, the magnetization reversal without a magnetic field is possible. In a case where the orientation direction of the magnetization M20 of the magnetic body 20 and the first spin sp1 is in orthogonal relationship, the torque applied to the magnetization M20 is a torque for rotating the magnetization M20 by 90°. An external force such as an external magnetic field is necessary for stable magnetization reversal.

Since the magnetic body 20 and the second ferromagnetic layer 2 are magnetically coupled to each other, in a case where the magnetization M20 is reversed, the magnetization M2 is reversed. In a case where the magnetization M2 is reversed, the relative angle of the first ferromagnetic layer 1 with the magnetization M1 changes, and the resistance value of the laminate 10 changes. The magnetoresistance effect element 100 stores data, based on the resistance value of the laminate 10. Therefore, the data writing to the magnetoresistance effect element 100 is completed through the above procedure.

The operation of data reading from the magnetoresistance effect element 100 will be described. First, the third switching element Sw3 and the second switching element Sw2, which are connected to the magnetoresistance effect element 100 from which data is to be read, are turned on. In a case where the third switching element Sw3 and the second switching element Sw2 are turned on, a read current flows in the z direction of the laminate 10.

The resistance value of the laminate 10 differs depending on whether the magnetization M1 and the magnetization M2 are parallel or antiparallel. In a case where the magnetization M1 and the magnetization M2 are parallel, the resistance value of the magnetoresistance effect element 100 is low. In a case where the magnetization M1 and the magnetization M2 are antiparallel, the resistance value of the magnetoresistance effect element 100 is high. The resistance value of the magnetoresistance effect element 100 is output as a potential difference in accordance with Ohm's law. Therefore, the data reading from the magnetoresistance effect element 100 is completed through the above procedure.

The magnetoresistance effect element 100 according to the first embodiment is divided into a magnetic body 20 responsible for magnetization reversal and a second ferromagnetic layer 2 responsible for change in resistance. Thus, the magnetization can be reversed even in a no magnetic field while having a large MR ratio.

Further, since the magnetic body 20 extends in the z direction, the contact area between the magnetic body 20 and the wiring 30 can be secured, and a large number of spins can be injected into the magnetic body 20. Further, since the magnetic body 20 extends in the z direction, the magnetization M20 of the magnetic body 20 is likely to be oriented in the z direction due to the shape anisotropy. In a case where the magnetic body 20 has shape anisotropy, the stability of the magnetization M20 is improved. Further, in a case where the magnetic body 20 are oriented in the z-direction, the magnetization direction of the first spin sp1 injected to the magnetization direction of the magnetic body 20 is parallel or anti-parallel. As a result, even under no magnetic field, magnetization reversal can be performed.

Second Embodiment

Figure 10:
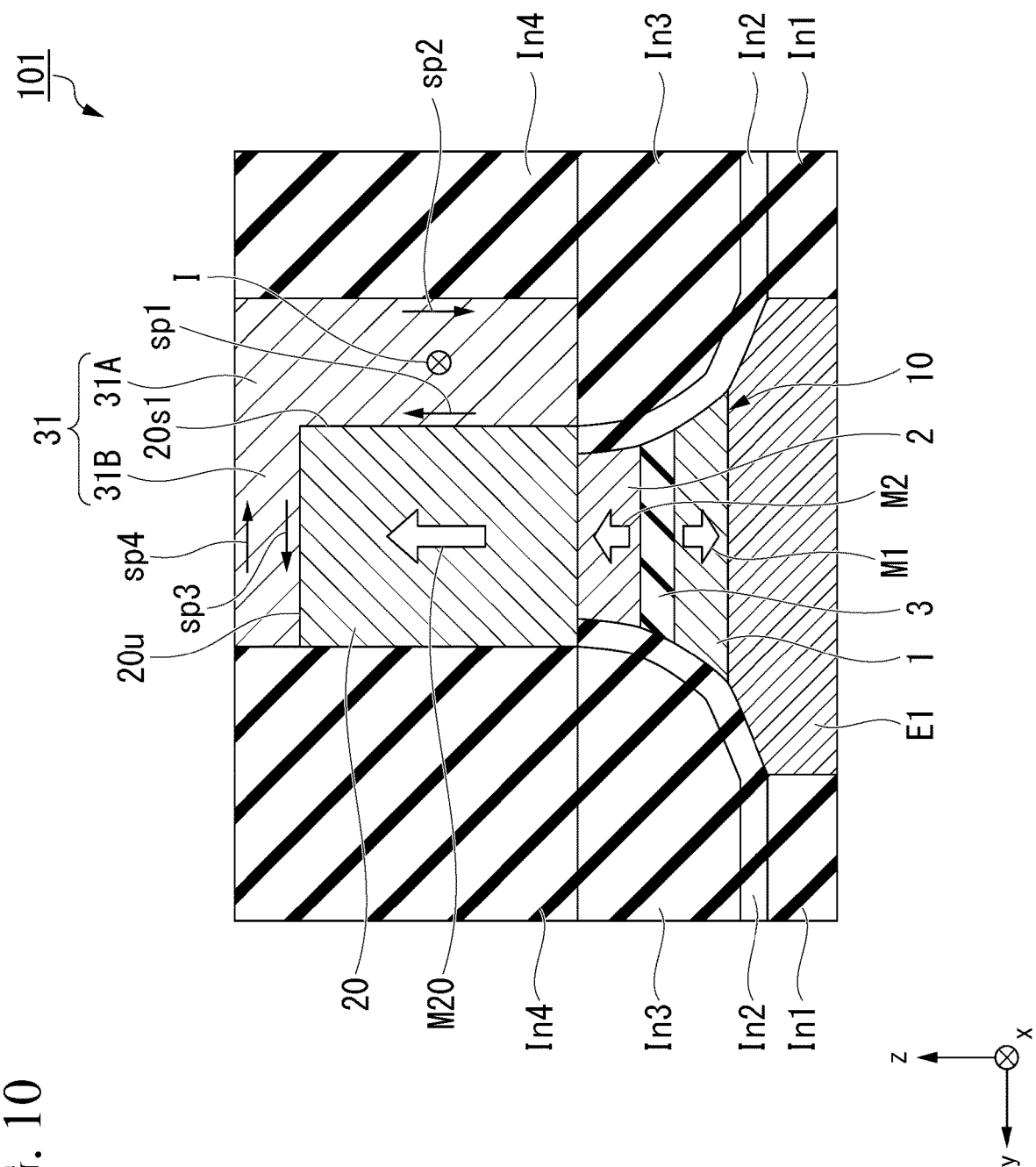
FIG. 10 is a cross-sectional view showing a characteristic part of the magnetic recording array according to a second embodiment.

FIG. 10 is a plan view showing a characteristic part of the magnetic recording array according to the second embodiment. FIG. 10 shows a cross section of the magnetoresistance effect element 101 cut in the yz plane. The shape of the wiring 31 of the magnetoresistance effect element 101 is different from that of the magnetoresistance effect element 100. In FIG. 10, the same components as those in FIG. 3 are represented by the same reference numerals, and a description thereof will not be repeated.

The wiring 31 has a first part 31A and a second part 31B. The first part 31A is connected to the first side surface 20s1 of the magnetic body 20, and the second part 31B is connected to the upper surface 20u.

The spin, which is generated by the spin Hall effect, is along the surface of the wiring 31. The third spin sp3 and the fourth spin sp4, which are generated in the second part 31B, are oriented in the y direction. The first spin sp1 and the third spin sp3 are injected into the magnetic body 20. The third spin sp3 triggers magnetization reversal of the magnetization M20, the magnetization reversal of the magnetization M20 is facilitated, and the time required for magnetization reversal becomes shorter.

The magnetoresistance effect element 101 can be manufactured, for example, by using the mask layer 95 as the same material as the wiring 30 so that the mask layer 95 remains.

The magnetoresistance effect element 101 according to the second embodiment has the same effect as the magnetoresistance effect element 100 according to the first embodiment.

Third Embodiment

Figure 11:
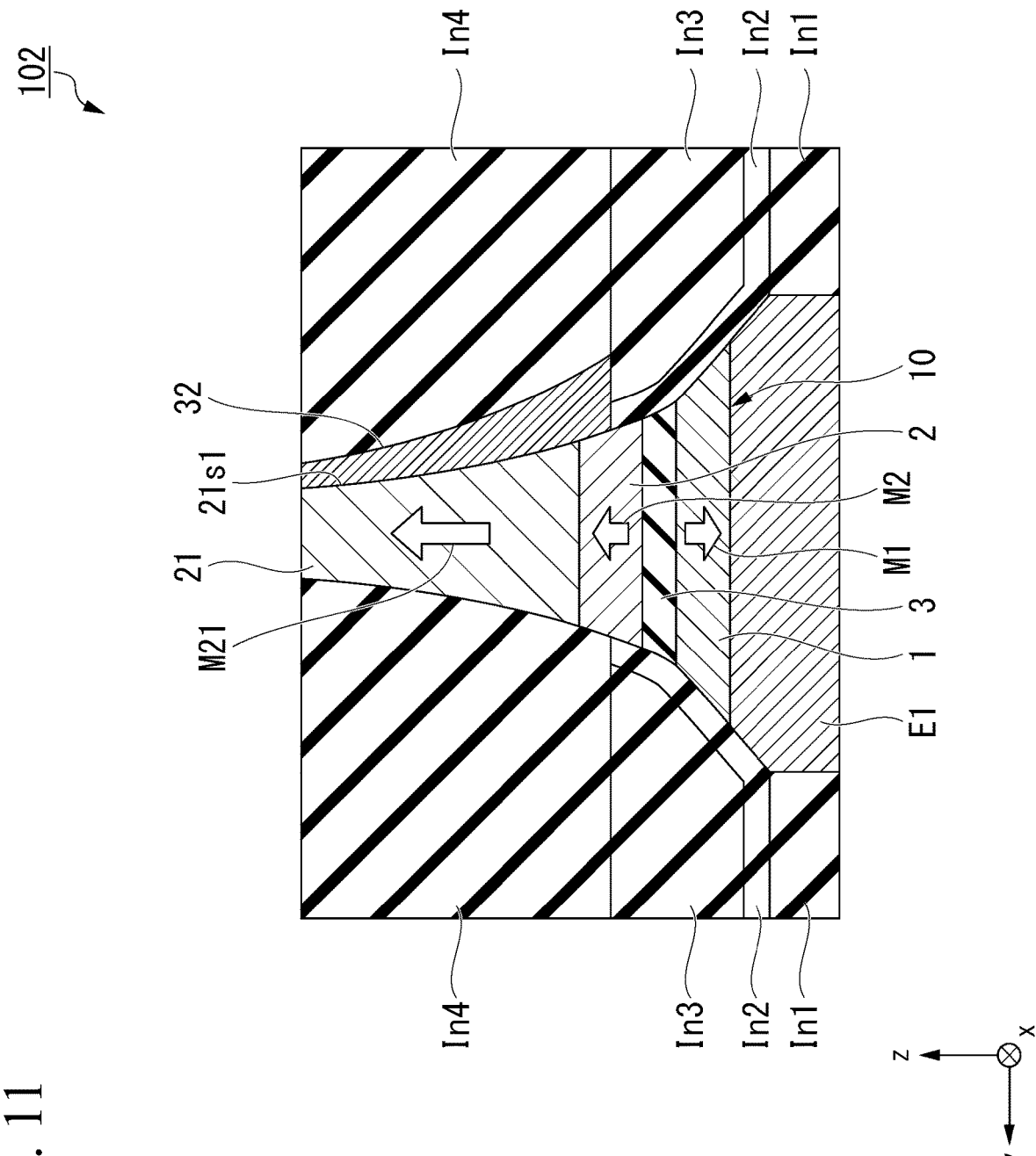
FIG. 11 is a cross-sectional view showing a characteristic part of the magnetic recording array according to a third embodiment.

FIG. 11 is a plan view showing a characteristic part of the magnetic recording array according to the third embodiment. FIG. 11 shows a cross section of the magnetoresistance effect element 102 cut in the yz plane. The shapes of the magnetic body 21 and the wiring 32 of the magnetoresistance effect element 102 are different from those of the magnetoresistance effect element 100. In FIG. 11, the same components as those in FIG. 3 are represented by the same reference numerals, and a description thereof will not be repeated.

The side surface of the magnetic body 21 is continuous with the side surface of the laminate 10, and the width is increased from the upper surface to the lower surface. The magnetic body 21 is produced, for example, by being processed at the same time as the laminate 10.

The wiring 32 is connected to the first side surface 21s1 of the magnetic body 21 and the side surface of the second ferromagnetic layer 2. The contact area between the first side surface 21s1 and the wiring 32 is larger than the contact area between the side surface of the second ferromagnetic layer 2 and the wiring 32. By injecting spin directly into the second ferromagnetic layer 2 from the wiring 32, the magnetization M21 of the magnetic body 21 can be easily reversed.

The magnetoresistance effect element 102 according to the third embodiment has the same effect as the magnetoresistance effect element 100 according to the first embodiment.

Fourth Embodiment

Figure 12:
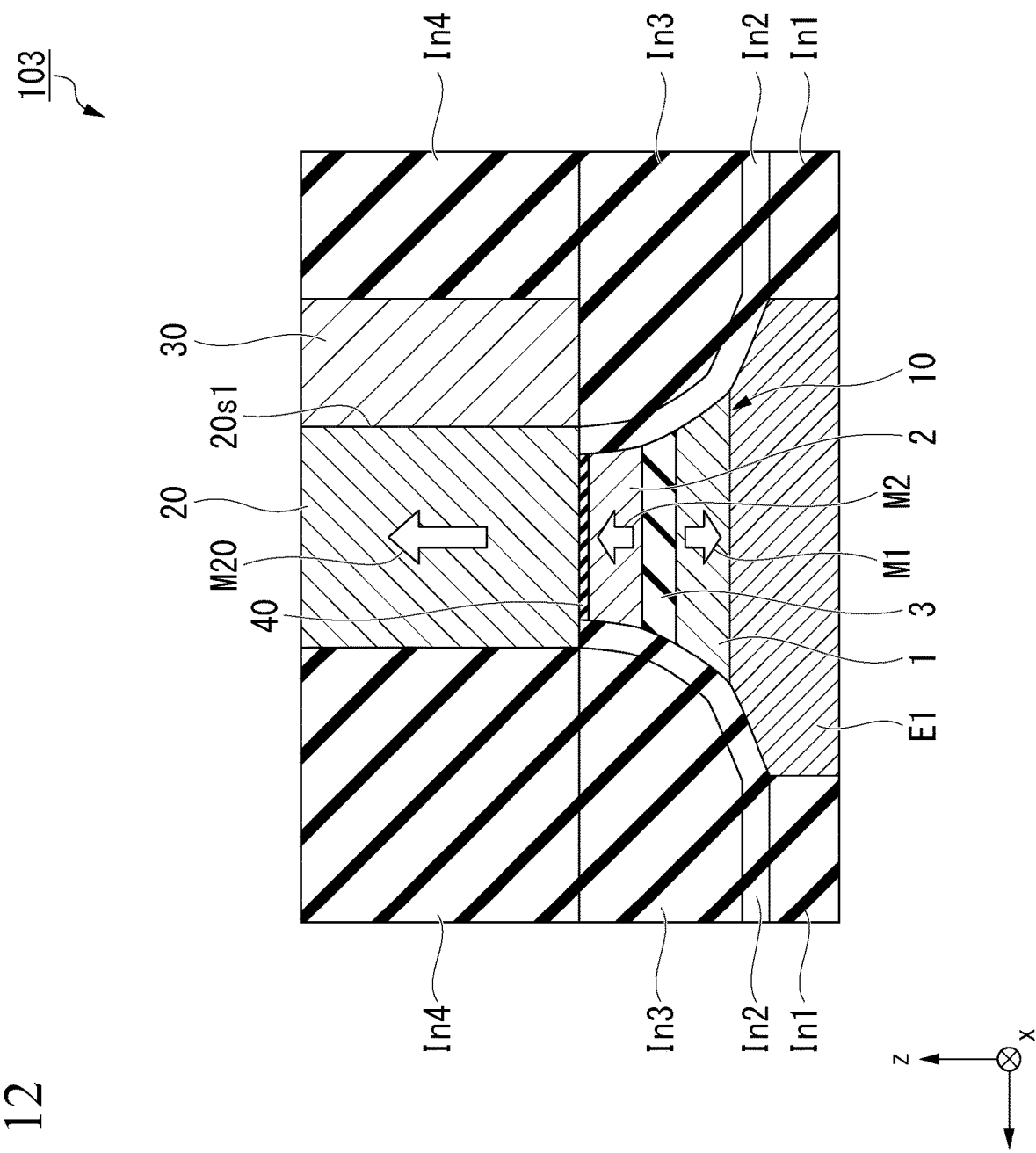
FIG. 12 is a cross-sectional view showing a characteristic part of the magnetic recording array according to a fourth embodiment.

FIG. 12 is a plan view showing a characteristic part of the magnetic recording array according to the fourth embodiment. FIG. 12 shows a cross section of the magnetoresistance effect element 103 cut in the yz plane. The magnetoresistance effect element 103 differs from the magnetoresistance effect element 100 in that the magnetoresistance effect element 103 has an intermediate layer 40. In FIG. 12, the same components as those in FIG. 3 are represented by the same reference numerals, and a description thereof will not be repeated.

The intermediate layer 40 is present between the second ferromagnetic layer 2 and the magnetic body 20. The second ferromagnetic layer 2 and the magnetic body 20 are magnetically coupled with the intermediate layer 40 interposed therebetween. The magnetic coupling may be ferromagnetic coupling or antiferromagnetic coupling. The intermediate layer 40 includes, for example, at least one selected from the group consisting of Ru, Ir, and Rh.

The magnetoresistance effect element 103 according to the fourth embodiment has the same effect as the magnetoresistance effect element 100 according to the first embodiment. Further, by providing the intermediate layer 40, the manufacturing process becomes simple, and it becomes easy to manufacture the magnetoresistance effect element 103.

Fifth Embodiment

Figure 13:
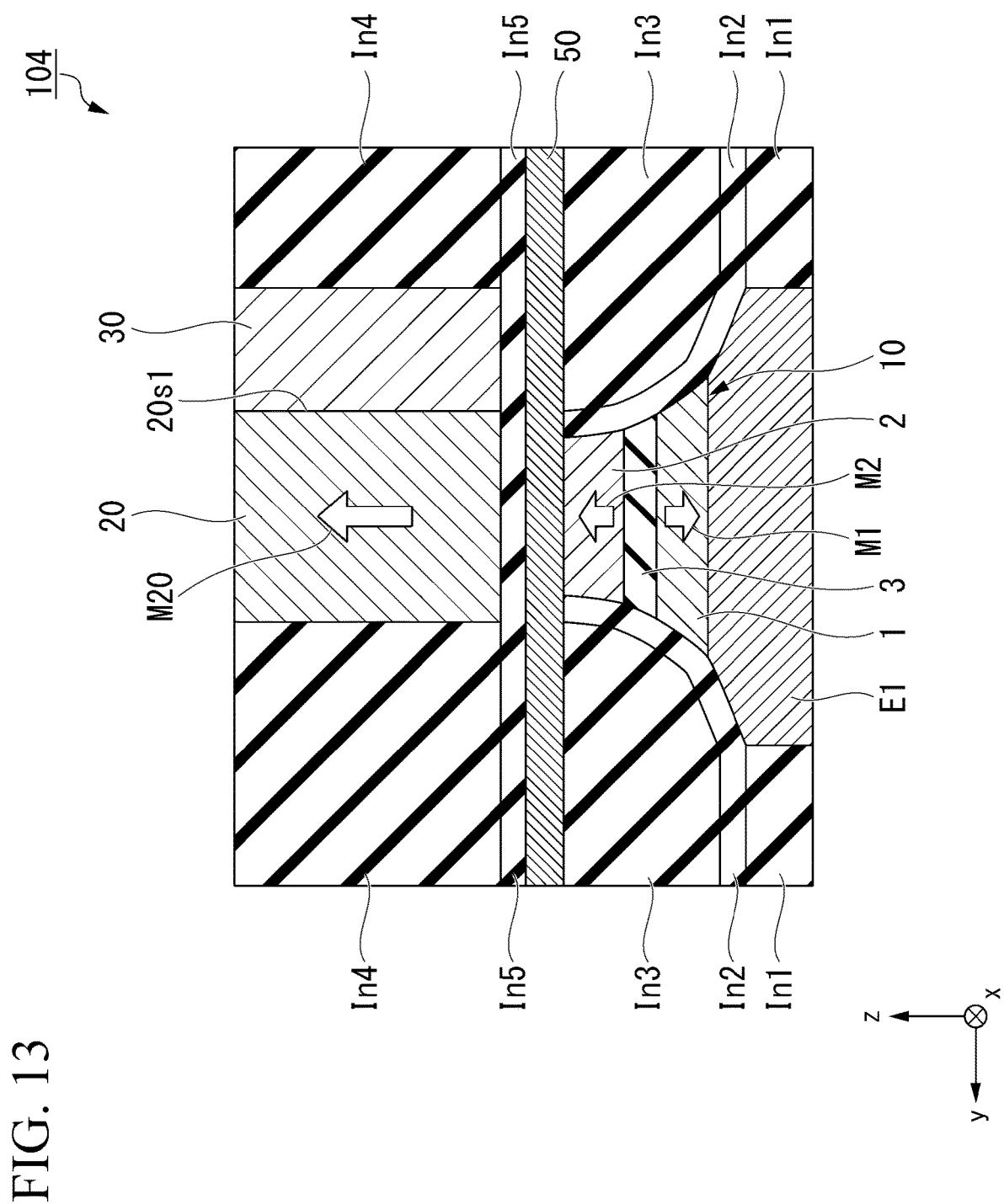
FIG. 13 is a cross-sectional view showing a characteristic part of the magnetic recording array according to a fifth embodiment.

FIG. 13 is a plan view showing a characteristic part of the magnetic recording array according to the fifth embodiment. FIG. 13 shows a cross section of the magnetoresistance effect element 104 cut in the yz plane. The magnetoresistance effect element 104 is different from the magnetoresistance effect element 100 in that the magnetoresistance effect element 104 has a second wiring 50 and an insulating layer In5. In FIG. 13, the same components as those in FIG. 3 are represented by the same reference numerals, and a description thereof will not be repeated.

The second wiring 50 and the insulating layer In5 are present between the magnetic body 20 and the second ferromagnetic layer 2. The second wiring 50 is connected to the second ferromagnetic layer 2. The insulating layer In5 is present between the second ferromagnetic layer 2 and the second wiring 50.

The second wiring 50 may be made of a conductive material. The second wiring 50 is, for example, Cu, Al, or Ag. Further, the second wiring 50 may be made of the same material as the wiring 30. As the insulating layer In5, it is possible to use the same material as the insulator In.

The magnetoresistance effect element 104 is different from the magnetoresistance effect element 100 in the behavior of writing and reading of data. In the magnetoresistance effect element 104, the magnetic field generated by the magnetic body 20 reverses the magnetization M20 of the second ferromagnetic layer 2. That is, the magnetoresistance effect element 104 is different in that the magnetoresistance effect element 104 utilizes the magnetic field generated by the magnetic body 20 when writing data. Further, when the magnetoresistance effect element 104 reads data, a read current is passed between the second wiring 50 and the electrode E1. The third switching element Sw3 is connected to the second wiring 50.

The magnetoresistance effect element 104 according to the fifth embodiment has the same effect as the magnetoresistance effect element 100 according to the first embodiment. Further, since the magnetic body 20 and the laminate 10 are electrically separated, it is possible to suppress the write current from branching to the laminate 10 side and improve the data writing efficiency. As a result, the magnetoresistance effect element 104 can reduce the current density of the write current.

Sixth Embodiment

Figure 14:
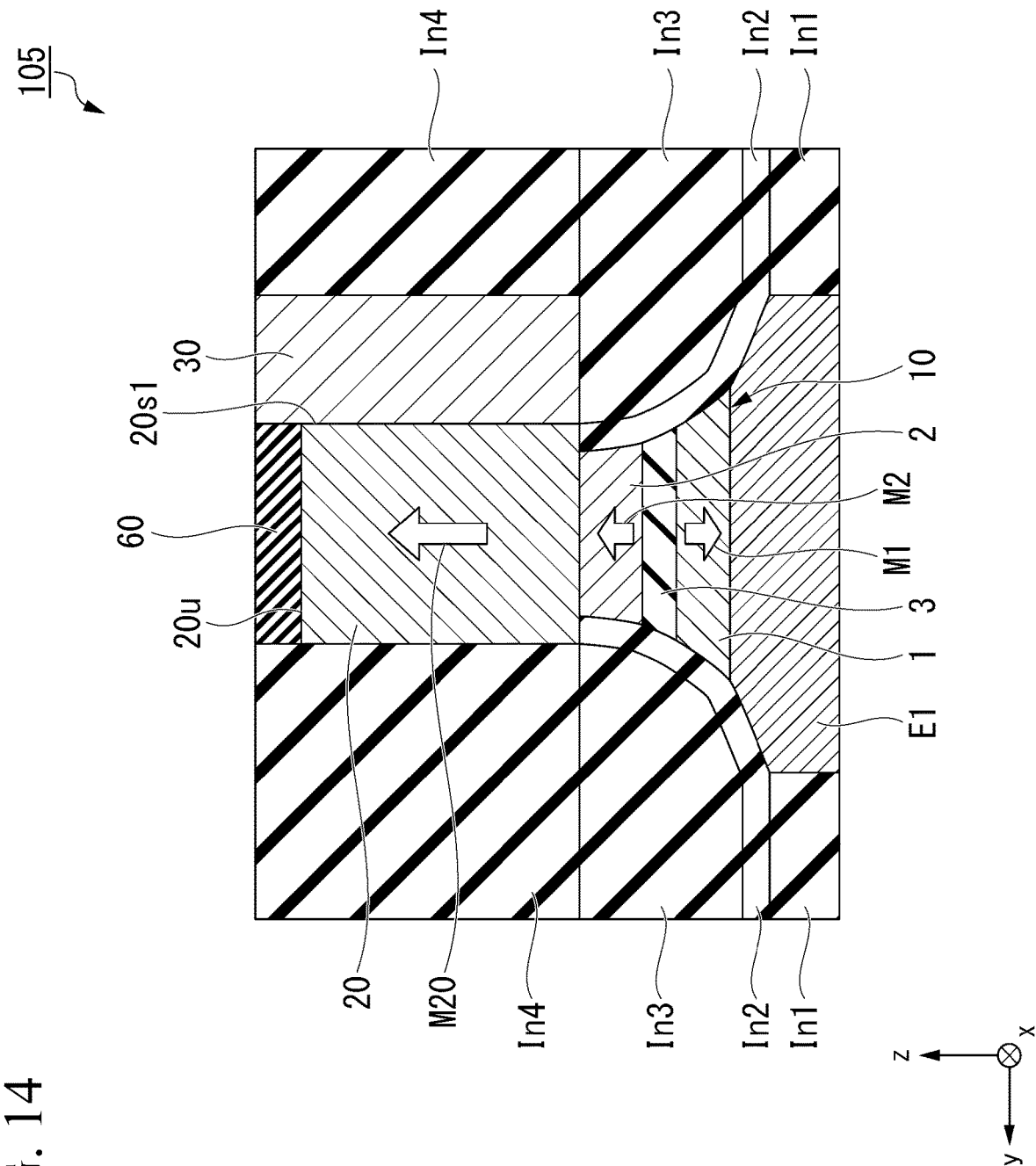
FIG. 14 is a cross-sectional view showing a characteristic part of the magnetic recording array according to a sixth embodiment.

FIG. 14 is a plan view showing a characteristic part of the magnetic recording array according to the sixth embodiment. FIG. 14 shows a cross section of the magnetoresistance effect element 105 cut in the yz plane. The magnetoresistance effect element 105 is different from the magnetoresistance effect element 100 in that the magnetoresistance effect element 105 has an oxide layer 60. In FIG. 14, the same components as those in FIG. 3 are represented by the same reference numerals, and a description thereof will not be repeated.

The oxide layer 60 is laminated on the upper surface 20u of the magnetic body 20. The oxide layer 60 is, for example, $AlO_x$, $MgO_x$, $SiO_x$, $HfO_x$, $TaO_x$, $WO_x$, or $PtO_x$. The oxygen included in the oxide layer 60 attracts the electrons included in the magnetic body 20 in the z direction, changes the electronic structure of the magnetic body 20, and causes the magnetization M20 to be strongly oriented in the z direction. Further, the oxide layer 60 induces interfacial perpendicular magnetic anisotropy and causes the magnetization M20 to be strongly oriented in the z direction. In a case where the magnetization M20 is strongly oriented in the z direction, the orientation property of the magnetization M2 of the second ferromagnetic layer 2 in the z direction is also enhanced, and the change in magnetic resistance (MR ratio) of the laminate becomes large.

The magnetoresistance effect element 105 according to the sixth embodiment has the same effect as the magnetoresistance effect element 100 according to the first embodiment.

Seventh Embodiment

Figure 15:
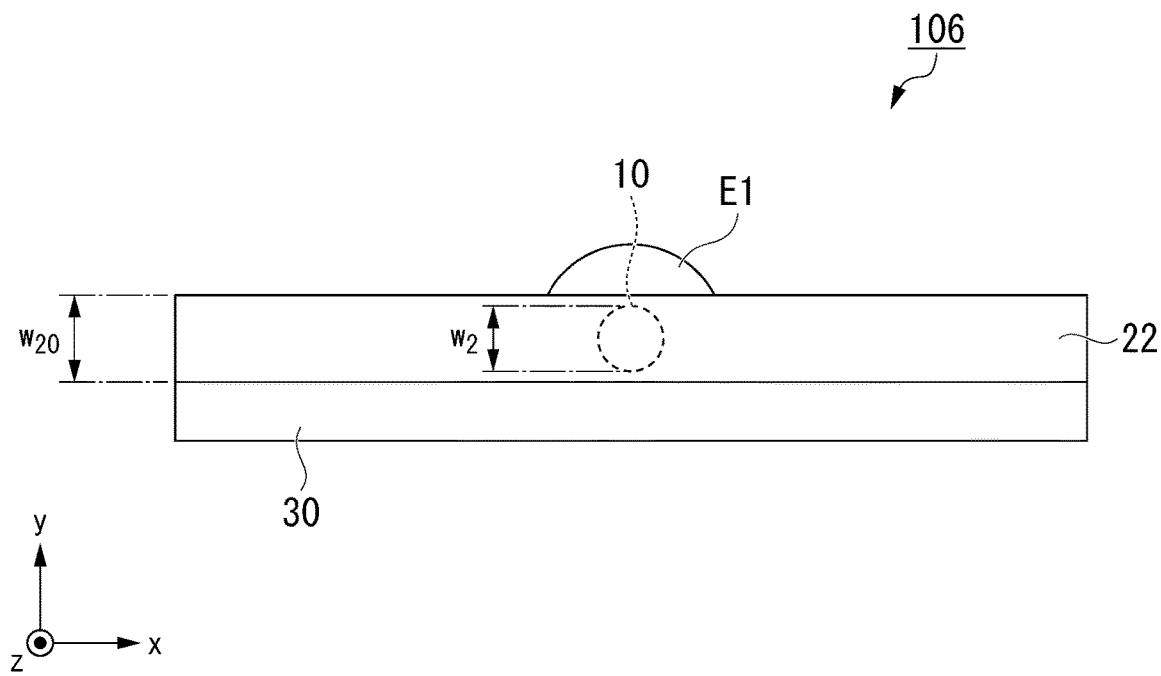
FIG. 15 is a plan view showing a characteristic part of the magnetic recording array according to a seventh embodiment.

FIG. 15 is a plan view showing a characteristic part of the magnetic recording array according to the seventh embodiment. FIG. 15 is a plan view showing the magnetoresistance effect element 106 from the z direction. The shape of the magnetic body 22 of the magnetoresistance effect element 106 is different from that of the magnetoresistance effect element 100. In FIG. 15, the same components as those in FIG. 4 are represented by the same reference numerals, and a description thereof will not be repeated.

The magnetic body 22 extends in the x direction along the wiring 30. By increasing the contact area between the magnetic body 22 and the wiring 30, a large number of spins can be injected into the magnetic body 22. Further, the amount of magnetization included in the magnetic body 22 is increased, and the magnetization reversal of the second ferromagnetic layer 2 can be stabilized.

The magnetoresistance effect element 106 according to the seventh embodiment has the same effect as the magnetoresistance effect element 100 according to the first embodiment.

Up to this point, preferred embodiments of the present invention have been illustrated based on the first to third embodiments. However, the present invention is not limited to the embodiments. For example, the characteristic configurations of each embodiment may be applied to other embodiments.

While preferred embodiments of the invention have been described and illustrated above, it should be understood that these are slope of the invention and are not to be considered as limiting. Additions, omissions, substitutions, and other modifications can be made without departing from the scope of the invention. Accordingly, the invention is not to be considered as being limited by the described description and is only limited by the scope of the appended claims.

EXPLANATION OF REFERENCES

1: first ferromagnetic layer
2: second ferromagnetic layer
2u, 20u: upper surface
3,92: non-magnetic layer
10: laminate
20, 21, 22: magnetic body
20b: lower surface
20s1, 21s1: first side surface
30, 31, 32: wiring
31A: first part
31B: second part
40: intermediate layer
50: second wiring
60: oxide layer
91, 93: ferromagnetic layer
94: magnetic body
95: mask layer
96: conductive layer
100, 101, 102, 103, 104, 105, 106: magnetoresistance effect element
200: magnetic recording array
B1, B2: ion beam
Cm: common wiring
E1, E2, E3: electrode
In: insulator
In1, In2, In3, In4, In5: insulating layer
M1, M2, M20, M21: magnetization
st: step
Wp: write wiring
Rp: read wiring

What is claimed is:

1. A magnetoresistance effect element comprising:
a laminate in which a first ferromagnetic layer, a non-magnetic layer, and a second ferromagnetic layer are laminated in order in a first direction;
a magnetic body that is present on the second ferromagnetic layer or above the second ferromagnetic layer of the laminate; and
a wiring that is in contact with a first side surface of the magnetic body and extends in a second direction crossing the first direction,
wherein a thickness of the second ferromagnetic layer in the first direction is thinner than a minimum length of the second ferromagnetic layer in a plane orthogonal to the first direction,
a thickness of the magnetic body in the first direction is thicker than a minimum length of the magnetic body in a plane orthogonal to the first direction, and
a direction of easy magnetization axis of the magnetic body and the second ferromagnetic layer is the first direction.

2. The magnetoresistance effect element to claim 1,
wherein the wiring is further in contact with an upper surface of the magnetic body.

3. The magnetoresistance effect element according to claim 1,
wherein the wiring is further in contact with a first side surface of the second ferromagnetic layer.

4. The magnetoresistance effect element according to claim 1,
wherein each of the second ferromagnetic layer and the magnetic body is made of a material or a composition different from each other.

5. The magnetoresistance effect element according to claim 1,
wherein the magnetic body includes two or more elements selected from the group consisting of Co, Tb, Fe, and Gd.

6. The magnetoresistance effect element according to claim 1,
wherein a lower surface of the magnetic body is larger than an upper surface of the second ferromagnetic layer, and
a step is formed at an interface between the first side surface of the magnetic body and the first side surface of the second ferromagnetic layer.

7. The magnetoresistance effect element according to claim 1, further comprising:
an intermediate layer between the second ferromagnetic layer and the magnetic body.

8. The magnetoresistance effect element according to claim 1, further comprising:
a second wiring and an insulating layer which are present between the magnetic body and the second ferromagnetic layer,
wherein the second wiring is in contact with the second ferromagnetic layer, and
the insulating layer is interposed between the second wiring and the magnetic body.

9. The magnetoresistance effect element according to claim 1, further comprising:
an oxide layer that is in contact with an upper surface of the magnetic body.

10. A magnetic memory comprising:
a plurality of the magnetoresistance effect elements according to claim 1.

* * * * *